United States Patent [19]

Watanabe et al.

[11] Patent Number: 4,998,155

[45] Date of Patent: Mar. 5, 1991

[54] RADIATION-HARDENED SEMICONDUCTOR DEVICE WITH SURFACE LAYER

[75] Inventors: Kikuo Watanabe, Hachioji; Tohru Nakamura, Tanashi; Toru Toyabe, Kokubunji; Takahiro Okabe, Nishitama; Minoru Nagata, Kodaira, all of Japan

[73] Assignee: Director-General of the Agency of Industrial Science and Technology, Tokyo, Japan

[21] Appl. No.: 73,305

[22] Filed: Jul. 13, 1987

Related U.S. Application Data

[63] Continuation of Ser. No. 629,807, Jul. 11, 1984, abandoned.

[30] Foreign Application Priority Data

Jul. 11, 1983 [JP] Japan .................... 58-124697

[51] Int. Cl.⁵ ............................. H01L 29/72
[52] U.S. Cl. ........................ 357/34; 357/35; 357/52; 357/91
[58] Field of Search ............. 357/34, 35, 91, 52, 357/52 D

[56] References Cited

U.S. PATENT DOCUMENTS

| | | | |
|---|---|---|---|
| 3,868,720 | 2/1975 | New et al. ........................ | 357/35 X |
| 4,047,217 | 9/1977 | McCaffrey et al. ............... | 357/34 |
| 4,066,473 | 1/1978 | O'Brien ............................ | 357/34 X |
| 4,165,516 | 8/1979 | Smulders ......................... | 357/34 |
| 4,259,680 | 3/1981 | Lepselter et al. ................ | 357/35 |
| 4,660,065 | 4/1987 | Carvajal et al. ................. | 357/52 X |

FOREIGN PATENT DOCUMENTS

| | | | |
|---|---|---|---|
| 0080761 | 9/1982 | European Pat. Off. ........... | 357/35 |
| 1385041 | 11/1964 | France ............................ | 357/52 D |
| 1358275 | 7/1974 | United Kingdom ............. | 357/52 D |

OTHER PUBLICATIONS

Bhattacharyya et al., "Dual Base Lateral Bipolar Transistor", *IBM Technical Disclosure Bulletin*, vol. 20, No. 4, Sep. 1977, pp. 1313–1314.

Primary Examiner—William Mintel
Attorney, Agent, or Firm—Antonelli, Terry, Stout & Kraus

[57] ABSTRACT

A radiation-hardened semiconductor device including a bipolar transistor is disclosed in which a highly-doped layer equal in conductivity type to and larger in impurity concentration than the base region of the transistor is formed in that portion of the surface of the base region which exists beneath an insulating film, to prevent minority carriers injected into the base region, from reaching the above-mentioned surface portion. Thus, the injected minority carriers can reach a collector region without being extinguished by the recombination at the surface of the base region.

13 Claims, 8 Drawing Sheets

RADIATION-HARDENED SEMICONDUCTOR DEVICE WITH SURFACE LAYER

This application is a continuation application of application Ser. No. 629,807, filed July 11, 1984, now abandoned.

BACKGROUND OF THE INVENTION

1. FIELD OF THE INVENTION

The present invention relates to a semiconductor device whose characteristics are scarcely deteriorated by ionizing radiations such as γ-rays, X-rays, and an electron beam.

2. DESCRIPTION OF THE PRIOR ART

Figure 1:
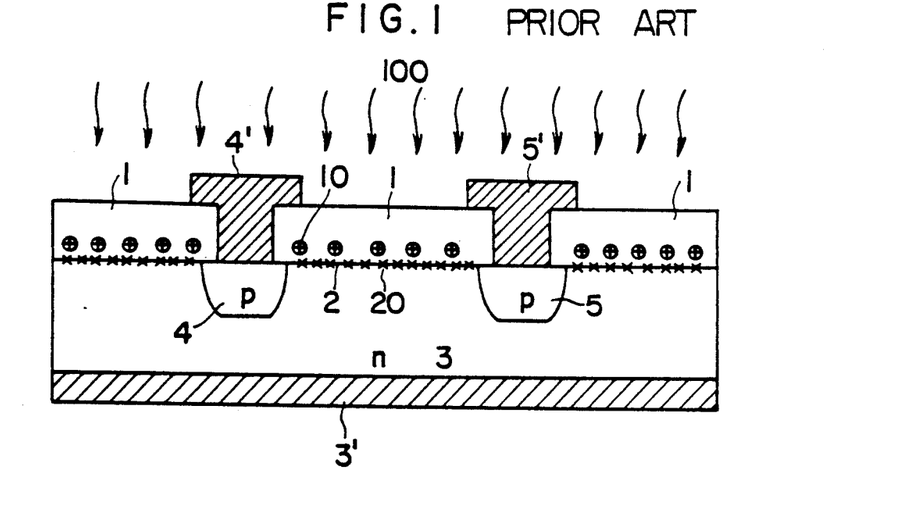
FIG. 1 is a fragmentary, sectional view showing a conventional, lateral pnp transistor.
Figure 2:
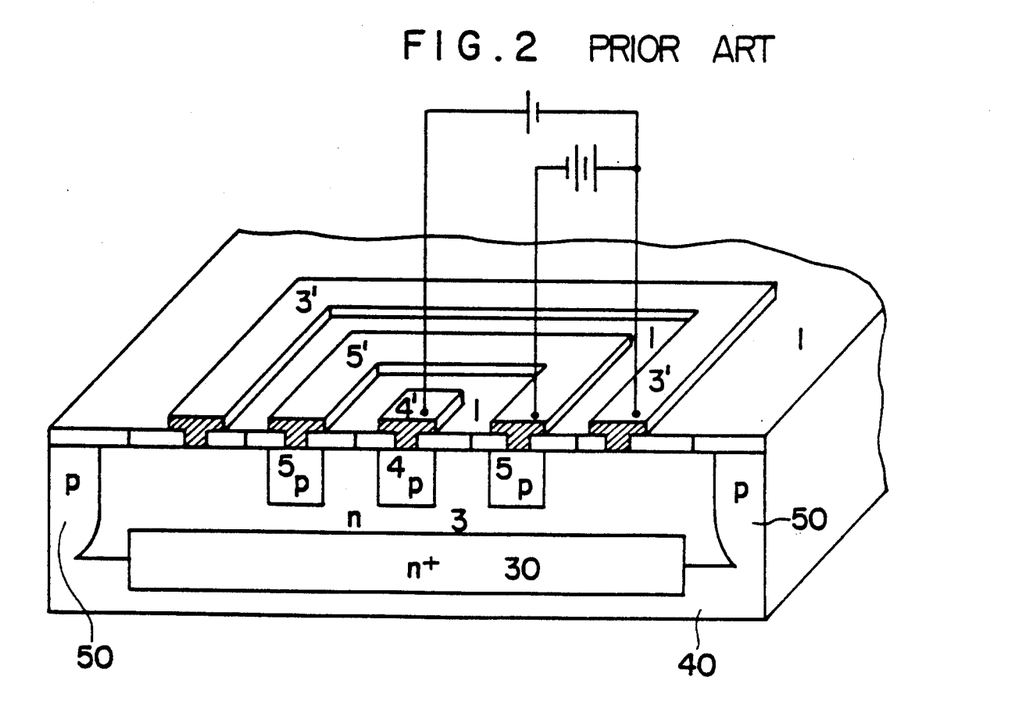
FIG. 2 is a perspective view, partly in cross-section, of another conventional, lateral pnp transistor.

When a conventional bipolar silicon transistor, for example, a lateral bipolar silicon transistor which includes an emitter 4, a base 3, a collector 5, and an oxide film 1 kept in contact with the surface of an active base region, in a manner such as shown in FIG. 1, is irradiated with an ionizing radiation 100, a positive charge 10 is formed in the oxide film 1, and a surface state 20 is formed at an interface 2 between the oxide film and silicon. Reference numerals 4' and 5' in FIG. 1 respectively represent emitter and collector electrodes. The number of surface states increases exponentially with the total dose of the ionizing radiation 100. The surface state 20 acts as the recombination center, and therefore increases the surface recombination rate of minority carriers. Accordingly, when an ionizing radiation is incident upon a lateral transistor such as shown in FIG. 2 (in FIG. 2, reference numerals 3', 4' and 5' represent base, emitter and collector electrodes, respectively, and 40 and 50 represent the semiconductor substrate and an isolating region, both of p-conductivity), the current amplification factor $h_{FE}$ of the transistor indicated by a curve 300 in FIG. 3 becomes far smaller, as compared with the current amplification factor at a time before the transistor is exposed to the radiation (namely, the current amplification factor indicated by a curve 200 in FIG. 3). Specifically, the reduction in current amplification factor due to the ionizing radiation is remarkable in a low current region. This is because a surface recombination current is increased by exposing the transistor to the ionizing radiation. Now, the surface recombination current will be explained below in detail.

Figure 4:
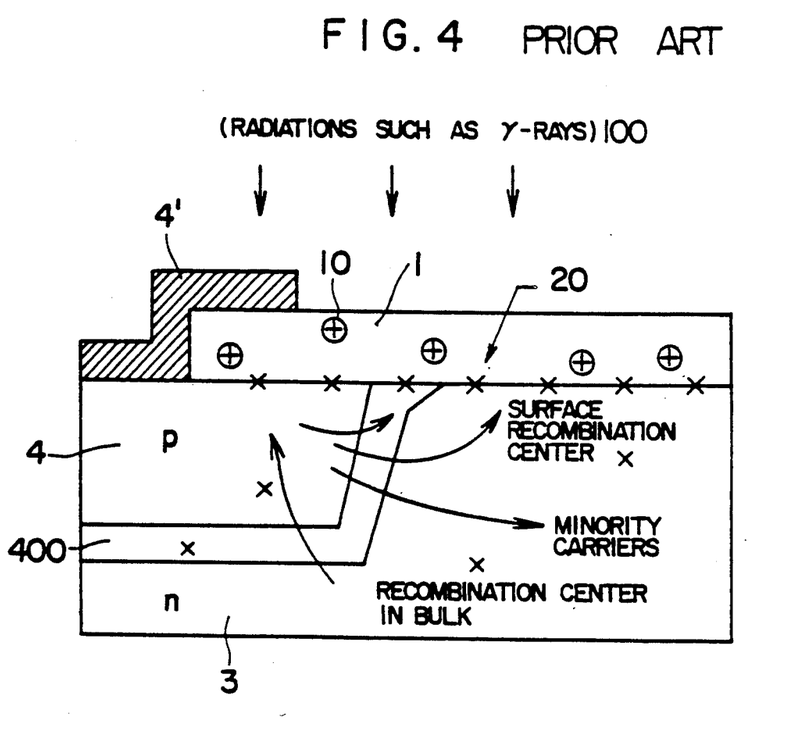
FIG. 4 is a sectional view showing a fundamental pn junction part of a bipolar element.

FIG. 4 shows a fundamental pn junction part of a bipolar element. Referring now in particular to the drawings, wherein like reference characters designate like or corresponding parts throughout, there is shown a depletion layer designated by reference numeral 400. When the number of surface states 20 caused by an ionizing radiation 100 is increased, the surface recombination rate of minority carriers is also increased. In more detail, the surface recombination rate is approximately proportional to the number of surface states. Further, the surface recombination current is proportional to the above surface recombination rate of minority carriers. Therefore, the surface recombination current increases with the radiation dose. Further, the surface recombination occurs not only in a region between an emitter 4 and a collector 5 but also in a peripheral portion of each of the emitter 4 and collector 5, and such recombinations also should be prevented.

Figure 5:
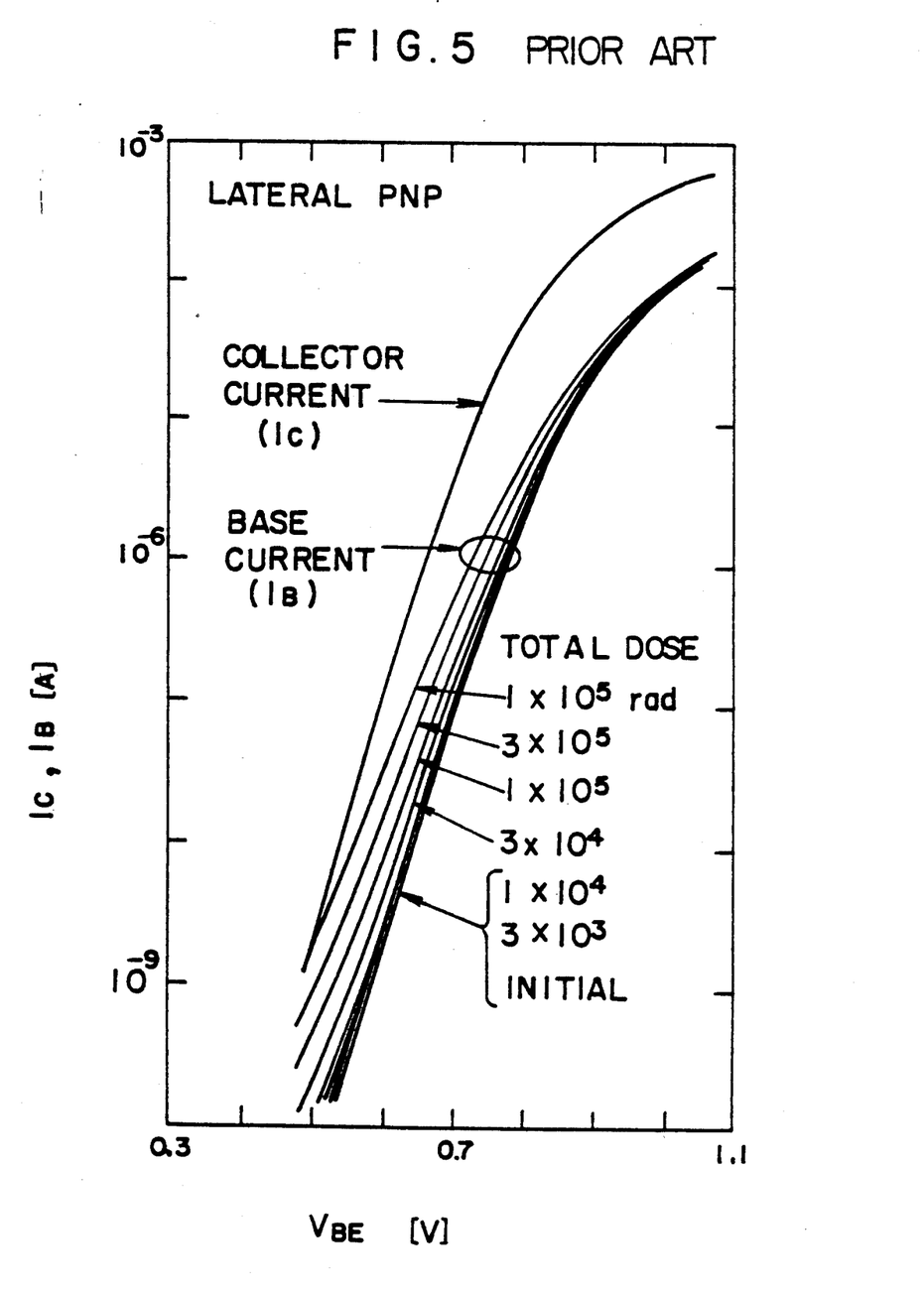
FIG. 5 is a graph showing relations between base-emitter voltage $V_{BE}$ and collector current $I_C$ or base current $I_B$ for various values of total radiation dose.

FIG. 5 shows relations between base-emitter voltage $V_{BE}$ and collector current $I_C$ or base current $I_B$ at an actual lateral transistor, which were experimentally obtained for various values of total radiation dose. The current amplification factor $h_{FE}$ is defined by a ratio of the collector current $I_C$ to the base current $I_B$. As can be seen from FIG. 5, the collector current $I_C$ is scarcely affected by the radiation. That is, the above experimental results show that a reduction in current amplification $h_{FE}$ caused by the radiation is based upon an increase in base current $I_B$. The increase in base current is considered to be caused by an increase in surface recombination current.

Figure 6:
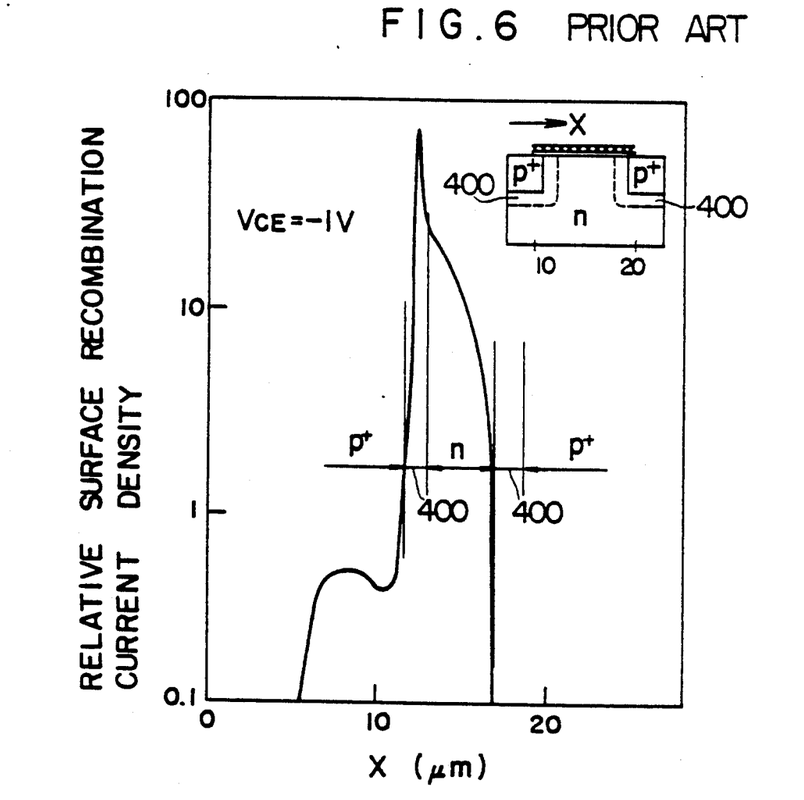
FIG. 6 is a graph showing the surface recombination current density distribution in a transistor illustrated in the upper righthand corner.

FIG. 6 shows a surface recombination current obtained by a two-dimensional device simulation using a computer. In FIG. 6, the Y-axis indicates a surface recombination current density in an arbitrary scale, and the X-axis a distance along the surface of a lateral pnp transistor shown in the upper righthand corner of FIG. 6. As shown in FIG. 6, not only the surface of a depletion layer but also the surface of an n-base layer is greatly affected by the radiation. In more detail, a pnp transistor and a npn transistor have a drawback that a portion of base layer kept in contact with an oxide film is affected by a radiation and thus the characteristics of the transistor are deteriorated by the radiation.

SUMMARY OF THE INVENTION

It is an object of the present invention to provide a semiconductor device which can eliminate the above-mentioned drawback of the prior art and has high hardening to radiations.

A reduction in current amplification factor at a low current region caused by radiation is based upon the following fact. When a minority carrier injected into a base region reaches the surface of the base region, that is, an interface between an oxide film and silicon, a recombination process takes place at a surface state formed by the radiation, thereby increasing a base current. In view of the above fact, a semiconductor device according to the present invention is formed so that the whole surface of a base region cannot be readily accessed by minority carriers, to reduce a surface recombination current, thereby preventing the reduction in current amplification factor.

DESCRIPTION OF THE PREFERRED EMBODIMENTS

Now, a first embodiment of a semiconductor device according to the present invention will be explained below, with reference to FIG. 7.

Figure 7:
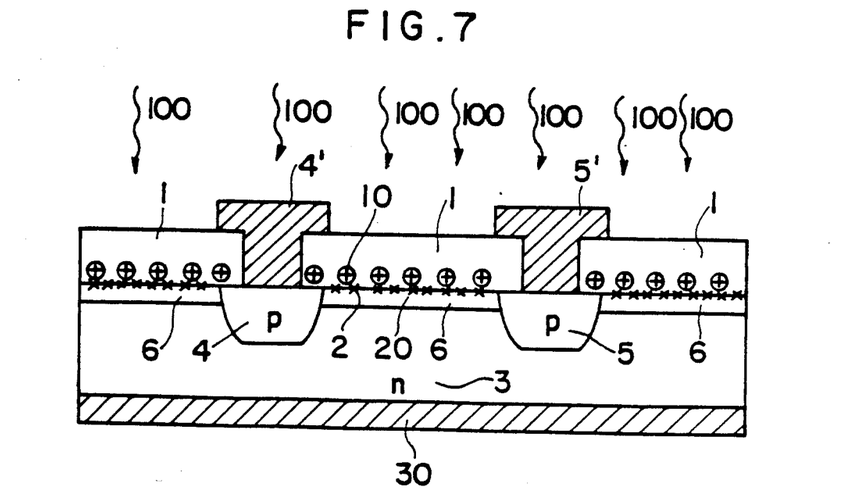
FIG. 7 is a sectional view showing a lateral pnp transistor according to the present invention.

FIG. 7 is a fragmentary, sectional view showing the first embodiment, which is a lateral pnp silicon transistor. Referring to FIG. 7, a highly-doped n-layer 6 having an impurity concentration of $10^{17}$ to $10^{21}$ cm$^{-3}$ (preferably $10^{18}$ to $10^{21}$ cm$^{-3}$) is formed in the whole of that surface of an n-base region 3 which is kept in contact with an insulating film (for example, an oxide film) 1. The characteristic feature of the present invention resides in that the highly-doped layer 6 is formed in the above-mentioned surface portion of the base region. The layer 6 can be readily formed by well-known semiconductor techniques such as thermal diffusion and ion implantation. The following advantage is obtained by forming the highly-doped layer 6. That is, minority carriers which are injected from a p-emitter region 4 into the n-base region 3, (namely, positive holes injected into the base region 3) are prevented from diffusing into an oxide film-silicon interface 2 where a recombination center is present, by a potential barrier which is formed on the basis of a difference in n-type impurity concentration between the highly-doped n-layer 6 formed beneath the oxide film 1 and the base region 3. In other words, almost all of the injected positve holes can reach a p-collector region without being extinguished by the recombination at the surface of the base region.

Figure 8:
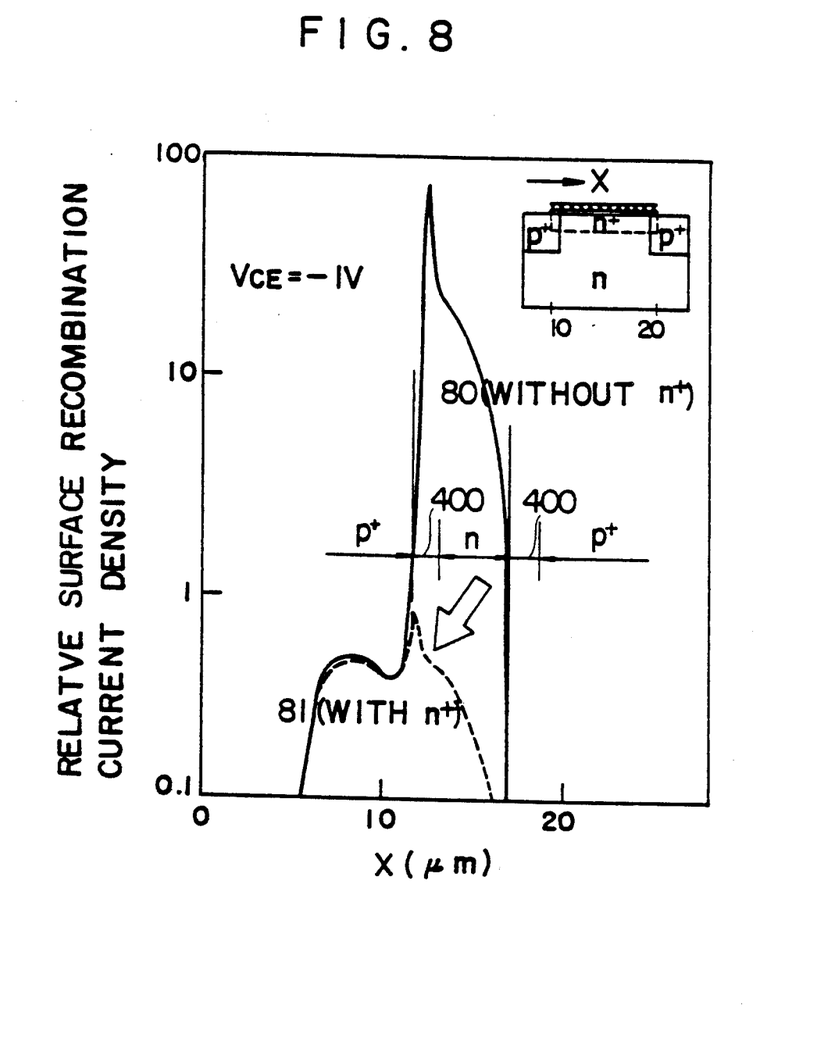
FIG. 8 is a graph showing the surface recombination current density distribution in a transistor illustrated in the upper righthand corner, together with the distribution shown in FIG. 6.

FIG. 8 shows surface recombination current density distribution curves obtained by the two-dimensional device simulation using a computer. As is apparent from FIG. 8, the surface recombination current density obtained for a transistor having the highly-doped layer 6 and indicated by a curve 81 is far smaller, as compared with that shown in FIG. 6 and indicated by a curve 80 in FIG. 8.

Figure 9:
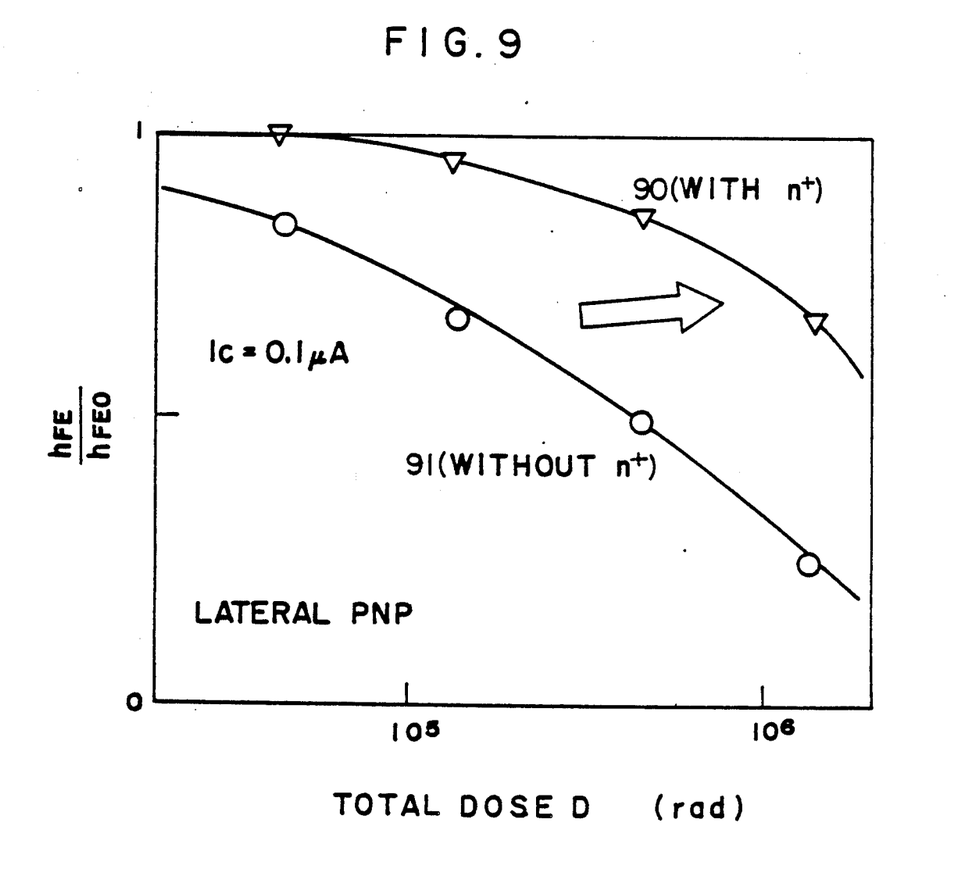
FIG. 9 is a graph showing a relation between the normalized current amplification factor of a lateral pnp transistor according to the present invention and the radiation dose given to the transistor, together with a similar relation at a conventional lateral pnp transistor.

A lateral pnp transistor according to the present invention was exposed to radiation, and the variation of the current amplification factor with the total radiation dose was measured at a collector current of 0.1 $\mu$A, together with a similar variation of a conventional transistor. The results of the measurement are shown in FIG. 9. In FIG. 9, a curve 90 indicates a reduction in current amplification of the transistor according to the present invention (that is, the transistor having an n$^+$-layer in the whole surface of a base region) due to radiation, and a curve 91 a similar reduction at the conventional transistor which does not include the n$^+$-layer. As is apparent from FIG. 9, the reduction in current amplification factor of the transistor having the n$^+$-layer due to the radiation is smaller by about one order of magnitude, as compared with a similar reduction at the conventional transistor.

Figure 3:
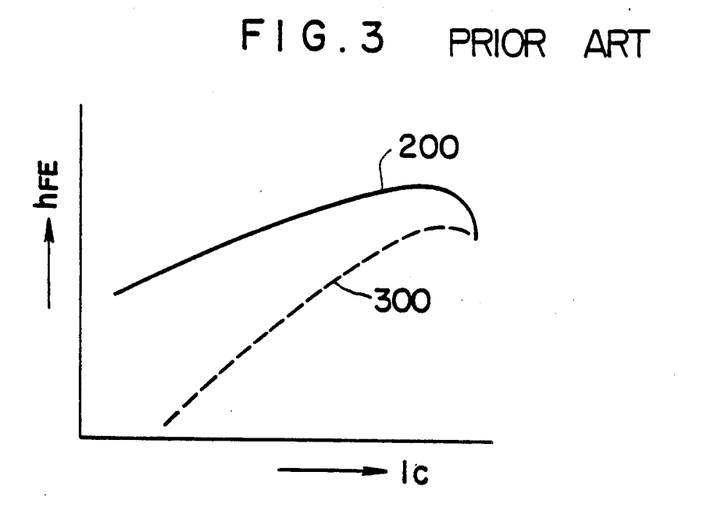
FIG. 3 is a graph showing a change in $I_C$-$h_{FE}$ characteristic (namely, collector current-current amplification factor characteristic) of the transistor shown in FIG. 2, caused by exposing the transistor to radiation.
Figure 10:
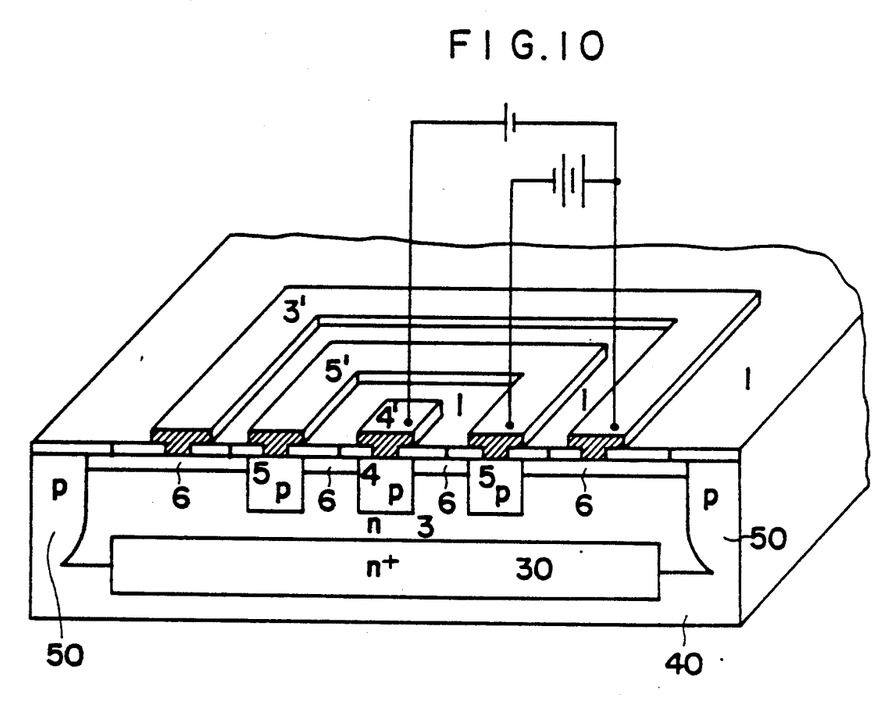
FIG. 10 is a perspective view, partly in cross-section, of another lateral pnp transistor according to the present invention.
Figure 11:
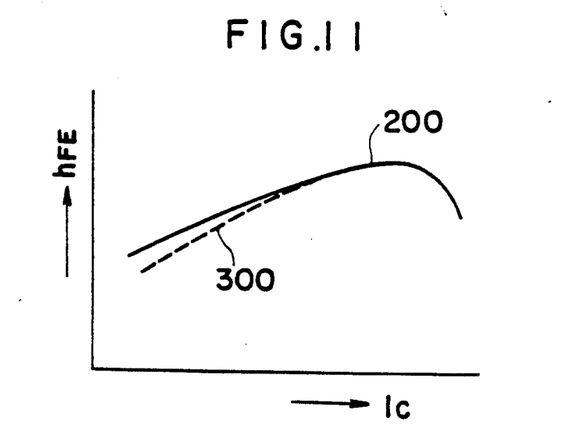
FIG. 11 is a graph showing a change in $I_C$-$h_{FE}$ characteristic of the transistor shown in FIG. 10, caused by exposing the transistor to radiation.

FIG. 10 shows a second embodiment of a semiconductor device according to the present invention. The present embodiment is a lateral pnp transistor which has a highly-doped n-layer 6 in the surface of a base region 3. FIG. 11 shows a change in current amplification factor $h_{FE}$ of the present embodiment caused by exposing the embodiment to radiation. Referring to FIG. 11, an $I_C$-$h_{FE}$ characteristic curve 200 at a time the present embodiment has not yet been exposed to the radiation, scarcely varies even after the embodiment has been exposed to the radiation, as indicated by a broken curve 300. It is to be noted that a reduction in current amplification factor of the present embodiment in a low collector current region caused by the radiation is far smaller, as compared with a similar reduction at a conventional transistor such as shown in FIG. 3.

Further, the highly-doped n-layer 6 is very advantageous in that the layer 6 can function not only as means for preventing the surface recombination at the whole surface of the base region but also as a layer kept in ohmic contact with a base electrode 3'. Since the highly-doped layer 6 is formed over the whole area of a transistor region, the base electrode 3' can be provided at a desired position. Further, the layer 6 decreases the parasitic resistance concerning the base region, and thus the area of the embodiment can be made small.

Figure 12:
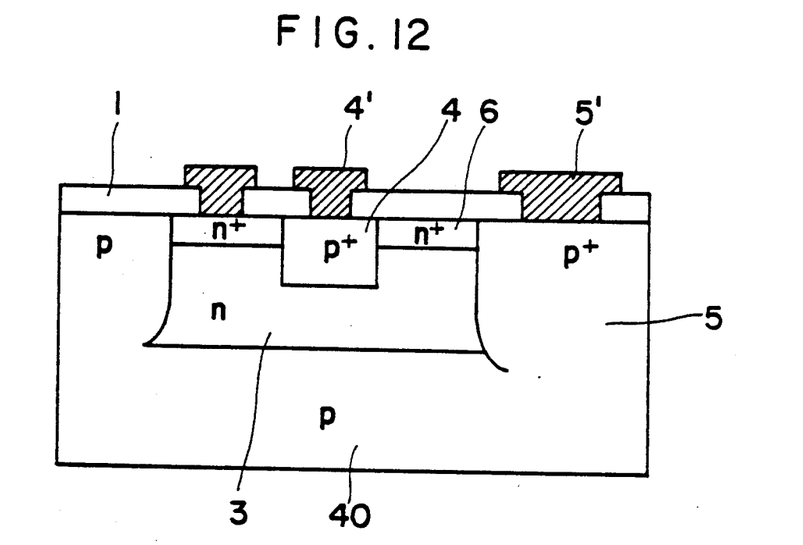
FIGS. 12 and 13 are sectional views showing other transistors according to the present invention.

FIG. 12 shows a third embodiment of a semiconductor device according to the present invention. The present embodiment is the so-called Sub-pnp transistor, and a vertical transistor is formed of a p$^+$-emitter region 4, an n-base region 3, and a p-substrate 40 serving as a collector region. Similarly to the first and second embodiments, an n$^+$-layer 6 is formed in the surface of the n-base region 3, to prevent positive holes which are from the p$^+$-emitter region 4 into the base region 3, from reaching surface recombination centers formed by radiation. Thus, the current amplification factor of the present embodiment is scarcely affected by the radiation.

Figure 13:
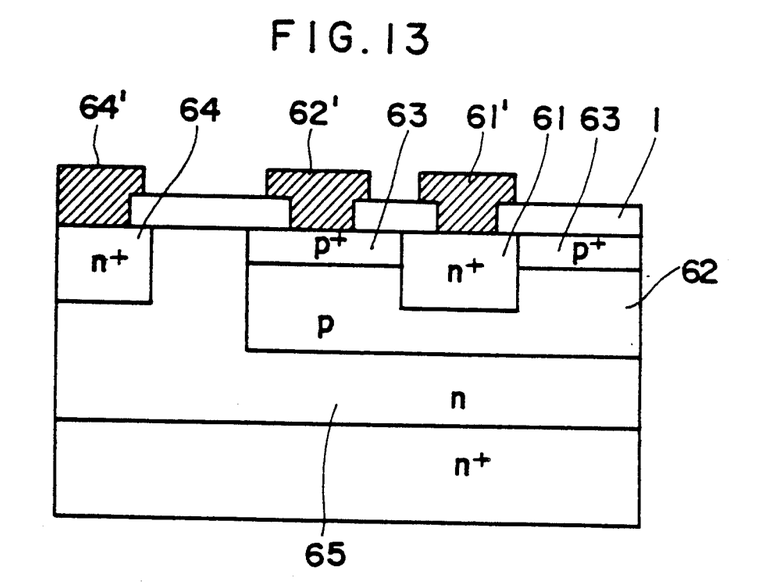

FIG. 13 shows a fourth embodiment of a semiconductor device according to the present invention. In FIG. 13, numerals 63, 64 and 65 respectively represent a surface P$^+$ region of the present invention, a collector electrode contacting region and a high resistivity collector region, respectively, and 61', 62' and 64' are, respectively, emitter, base and collector electrodes. The present embodiment is an npn transistor. As is evident from the previously-mentioned characteristic feature of the present invention, the present invention is applicable not only to a pnp transistor but also to an npn transistor. In more detail, a change in current amplification factor of a bipolar transistor caused by radiation is based upon a change in base current, and therefore it is very important to improve the structure of a base region. In the present embodiment, a p$^+$-layer 63 is formed in the whole surface of a p-base region 62, to prevent minority carriers which are injected from an n$^+$-emitter region 61 into the p-base region 62 (namely, electrons injected into the base region), from reaching an interface between the base region and an oxide film 1, thereby preventing the injected electrons from increasing a surface recombination current at the interface through the aid of radiation. Thus, the reduction in current amplification factor $h_{FE}$ of the present embodiment caused by the radiation can be greatly improved. The present embodiment is structurally different from a conventional npn transistor having the graft base structure, in the following ways:

The highly-doped p$^+$-layer 63 is formed in the whole surface of the base region 62. While, in the transistor having the graft base structure, a highly-doped graft base layer is formed in a portion of a base region, and a radiation produces an adverse effect on other portion of the base region not highly doped. The p$^+$-layer 63 may be smaller in depth than the n+-emitter region 61. While, the graft base layer is required to be larger in depth than the base region, to reduce the base resistance $r_{bb'}$. The p+-layer 63 is kept in contact with the n+-emitter region 61 at the periphery thereof. While, the graft base layer is spaced apart from an emitter region. It is needless to say that such differences are necessary to produce the effect of the present invention.

A fifth embodiment of a semiconductor device according to the present invention is formed by providing a plurality of radiation-resisting transistors on a single chip, using all or part of the first to fourth embodiments (namely, the radiation-resisting pnp transistors and radiation-resisting npn transistor). Thus, the fifth embodiment which is an integrated circuit, has high resistance to radiations.

As has been explained in the foregoing, according to the present invention, even when a surface state acting as the recombination center for minority carriers is formed at an interface between an insulating film and a transistor material by an ionizing radiation, the minority carriers are prevented from reaching the interface, thereby preventing an increase in surface recombination current. Therefore, a semiconductor device according to the present invention has high resistance to radiations.

Further, according to the present invention, a base electrode can be formed at a desired position, and the packing density of a semiconductor device can be increased on the basis of a reduction in area necessary for each semiconductor element. Furthermore, the base resistance can be reduced.

We claim:

1. A radiation-hardened semiconductor device, adapted to be used in a radiation-containing atmosphere and formed in a single semiconductor substrate having a main surface, said semiconductor device including a plurality of bipolar transistors formed in the single semiconductor substrate, each of said bipolar transistors comprising:
   an emitter region;
   a collector region;
   a base region extending to said main surface of said semiconductor substrate, said base region including a first layer and a second layer of the same conductivity type in contact with each other, said first layer being highly doped with a surface impurity concentration of $10^{17}$ to $10^{21}$ cm$^{-3}$, said first layer having a larger impurity concentration than an impurity concentration of said second layer; and
   insulating films in contact with each said base region, said first layer of each said base region being in contact with said insulating films and said second layer not being in contact with the insulating films, said first layer being interposed between said insulating films and said second layer such that said first layer separates said second layer from said insulating films.

2. A radiation-hardened semiconductor device according to claim 1, wherein the surface impurity concentration of said highly-doped first layer lies in a range from $10^{18}$ to $10^{21}$ cm$^{-3}$.

3. A radiation-hardened semiconductor device according to claim 1, wherein said bipolar transistor is a lateral pnp transistor.

4. A radiation-hardened semiconductor device according to claim 1, further including a base electrode provided in electrical contact with said base region, said base electrode being in ohmic contact with said highly-doped layer.

5. A radiation-hardened semiconductor device according to claim 1, wherein said insulating films are oxide films.

6. A radiation-hardened semiconductor device according to claim 1, wherein said bipolar transistor transistors are vertical bipolar transistors.

7. A radiation-hardened semiconductor device according to claim 1, wherein the highly-doped first layer is the surface region of the entire base region.

8. A radiation-hardened semiconductor device according to claim 1, wherein the highly-doped first layer contacts the emitter region of the bipolar transistor.

9. A radiation-hardened semiconductor device according to claim 2, wherein the semiconductor substrate is made of silicon and the insulating films are made of silicon oxide.

10. A radiation-hardened semiconductor device according to claim 3, wherein the collector region surrounds the emitter region and is spaced therefrom, with the base region occupying the space between the collector region and the emitter region in a surface region extending to the main surface of the semiconductor substrate.

11. A radiation-hardened semiconductor device according to claim 1, wherein all surfaces of said insulating films that are in contact with said base region are in contact with said highly-doped first layer of said base region.

12. A radiation-hardened semiconductor device according to claim 8, wherein each of the highly-doped first layer and the emitter region extend from the main surface of the semiconductor substrate, the emitter region extending to a greater depth than the depth to which the highly-doped first layer extends.

13. A radiation-hardened semiconductor device according to claim 12, wherein the highly-doped first layer is the surface region of the entire base region.

* * * * *